United States Patent [19]
Tonomura et al.

[11] Patent Number: 5,990,757
[45] Date of Patent: Nov. 23, 1999

[54] GALLIUM ARSENIDE MONOLITHIC MICROWAVE INTEGRATED CIRCUITS EMPLOYING THERMALLY BUMPED DEVICES

[75] Inventors: S. Doug Tonomura, La Mirada; James M. Harris, Encinitas; Christopher A. Moye, El Segundo, all of Calif.

[73] Assignee: Raytheon Company, Lexington, Mass.

[21] Appl. No.: 09/090,700

[22] Filed: Jun. 5, 1998

[51] Int. Cl.⁶ .................... H01P 1/22; H01L 23/12
[52] U.S. Cl. .................. 333/17.2; 257/522; 257/728; 333/247
[58] Field of Search .................... 333/104, 17.2, 333/247; 257/522, 706, 707, 728, 778, 780, 781, 664

[56] References Cited

U.S. PATENT DOCUMENTS

| | | | |
|---|---|---|---|
| 5,510,758 | 4/1996 | Fujita et al. | 257/778 X |
| 5,528,203 | 6/1996 | Mohwinkel et al. | 333/247 X |
| 5,610,563 | 3/1997 | Mohwinkel | 257/778 X |

Primary Examiner—Paul Gensler
Attorney, Agent, or Firm—Leonard A. Alkov; William C. Schubert; Glenn H. Lenzen, Jr.

[57] ABSTRACT

Flip chip monolithic microwave integrated circuits (MMIC) devices formed on gallium arsenide substrates and use thermally bumped diodes and field effect transistor devices to achieve improved heat dissipation and power protection. Flip chip limiter MMIC devices and transmit/receive switch MMIC devices are specifically provided by the present invention. The flip chip gallium arsenide limiter and transmit/receive switch MMIC devices use plated metallized bumps for both I/O connections and for thermal connections to a host substrate (aluminum nitride). The present invention also incorporates coplanar waveguide transmission line, thereby eliminating backside processing of the gallium arsenide substrates. The transmit/receive switch device provides power protection in both transmit and receive modes.

11 Claims, 3 Drawing Sheets

GALLIUM ARSENIDE MONOLITHIC MICROWAVE INTEGRATED CIRCUITS EMPLOYING THERMALLY BUMPED DEVICES

BACKGROUND

The present invention relates generally to monolithic microwave integrated circuits (MMIC) devices, and more particularly, to flip chip MMIC devices formed on Gallium Arsenide that employ thermally bumped diode and field effect transistor (FET) devices.

Flip chip technology involves methods used to interconnect semiconductor die to a host substrate. Generally, bumps (solder, or hard plated bumps) are used in place of wirebonds for I/O connections. Flip chip bump interconnection technology is a concept that has been around for many years. Most of the past work in this technology area has concentrated on the use of solder bump technology in conjunction with silicon-based integrated circuits.

The closest known prior art relating to the present flip chip limiter is a conventional face-up limiter MMIC device. The closest known prior art relating to the present transmit/receive switch is a conventional face-up transmit/receive switch MMIC device. The limiter and face-up transmit/receive switch MMIC devices require full wafer processing, including costly backside processing such as wafer thinning, along with via and backside metallization. Because this design is based on conventional microstrip transmission line media, the performance of this circuit is very sensitive to backside processing, especially wafer thinning. Finally, and most importantly, gallium arsenide is not an excellent thermal conductor. Under high incident RF conditions, large amounts of heat will be seen at the locations of active devices. This heat must then be dissipated through the gallium arsenide. It is this heat dissipation limitation which limits the power protection capability of the prior art.

Accordingly, it is an objective of the present invention to provide for improved flip chip MMIC devices formed on Gallium Arsenide that employ thermally bumped diode and field effect transistor (FET) devices. It is a further objective of the present invention to provide for improved flip chip limiter monolithic microwave integrated circuits formed on Gallium Arsenide employing thermal bumped diode devices. It is yet another objective of the present invention to provide for improved transmit/receive switch monolithic microwave integrated circuits formed on Gallium Arsenide employing thermal bumped FET devices.

SUMMARY OF THE INVENTION

To accomplish the above and other objectives, the present invention provides for flip chip monolithic microwave integrated circuit (MMIC) devices formed on gallium arsenide (GaAs) and use thermally bumped diode and FET devices to achieve improved heat dissipation and power protection. Flip chip limiter MMIC devices and transmit/receive switch MMIC devices are specifically provided by the present invention. The flip chip gallium arsenide limiter and transmit/receive switch MMIC devices use plated metallized bumps for both I/O connections and for thermal connections to a host substrate (aluminum nitride). The present invention also incorporates coplanar waveguide transmission line eliminating the need for backside processing of the gallium arsenide substrates.

More specifically, one embodiment of the present invention comprises a flip chip passive limiter monolithic microwave integrated circuit device formed on gallium arsenide employing thermal bumped diode devices. The flip chip gallium arsenide limiter MMIC device uses plated metallized "hard" bumps for RF input/output connections to a host substrate (aluminum nitride). The passive limiter also incorporates coplanar waveguide transmission media, thus eliminating the need for backside processing.

The passive limiter is utilized as built-in full-time protection for transmit/receive modules, which protect sensitive devices in the receive path from high RF environments. The reflective limiter MMIC device is "flip" mounted on the host substrate (aluminum nitride) using plated bumps for RF in/out connections to the host substrate. The novelty of this embodiment involves the structure and method of landing plated metallized bumps over a bridge of diodes (peak hot zones), allowing a direct thermal path away from active regions. By utilizing thermal bumps directly over the hot zones, the limiter can withstand much greater amounts of incident RF power in comparison to face-up MMIC devices without thermal bumps. In addition, the coplanar waveguide transmission line media eliminates the need for a ground plane on the backside of the MMIC device. Therefore, no backside processing steps (i.e., wafer thinning, via and backside metallization) are required. In doing so, wafer line yields are improved, and the performance sensitivity to gallium arsenide substrate thickness is eliminated.

The passive limiter is a reflective limiter, and the circuit must handle large amounts of RF energy. Large amounts of incident power are absorbed by the diode because of its series resistance. Hence, the diode junction temperature is a key factor in terms of performance of the limiter. The key advantage of the present invention stems from the application of thermal bumps over the hot zones (diodes) of the limiter. The use of thermal bumps over the diodes provides for a direct thermal path away from the device. In doing so, the power handling of the limiter is dramatically improved. This novel technique can be applied to any diode based limiter, including those using MIN and PIN diodes. Since a uniplanar design approach (using coplanar waveguide transmission line media) is employed, no backside processing is required. Therefore, the performance of the flip chip limiter is not susceptible to variations in wafer thinning, and the negative impact of via inductance. The use of flip chips also produce assembly and cost benefits.

A second embodiment of the present invention provides for a transmit/receive switch monolithic microwave integrated circuit device formed on Gallium Arsenide employing thermal bumped FET devices. The transmit/receive switch device is utilized to provide built-in protection for transmit/receive modules, protecting sensitive devices in the receive path from high RF environments. This absorptive transmit/receive switch MMIC is "flip" mounted on the host substrate (aluminum nitride) using plated bumps for I/O connections to the host substrate. Again, the novelty of this embodiment involves the structure and method of landing plated metallized bumps over the source bridge of FET devices (peak hot zones), allowing a direct thermal path away from the active FET regions. By utilizing thermal bumps directly over the hot zones of this absorptive switch, the device can withstand much greater amounts of incident RF power in comparison to face-up MMIC devices without thermal bumps. In addition, the coplanar waveguide transmission line media eliminates the need for a ground plane on the backside of the MMIC device. Therefore, no backside processing steps (i.e., wafer thinning, via and backside metallization) are required. Thus, wafer line yields are improved, and the sensitivity of the performance of the switches to gallium arsenide substrate thickness is eliminated.

The transmit/receive switch device is an absorptive switch with on-chip loads, and the circuit must handle large amounts of RF energy. The key advantage of the present invention stems from the use of thermal bumps over the hot zones of the switch. The use of thermal bumps over the source bridge of the FET devices allows a direct thermal path away from the device. Thus, the power handling of the switch is improved dramatically. This improvement comes without the need for costly changes to established FET technology processes for power handling performance. Since a uniplanar design approach (by use of coplanar waveguide transmission line media) is employed, no backside processing is required. Therefore, the performance of the flip chip switch is not susceptible to variations in wafer thinning, and the negative impact of via inductance. This susceptibility to backside processing is evident in conventional face-up MMIC variants. The use of flip chips also results in assembly and cost benefits.

The present flip chip limiter MMIC and transmit/receive switch MMIC devices may be preferably used in transmit/receive modules. The transmit/receive modules are basic building blocks of airborne and ground based electronically-steered antenna.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
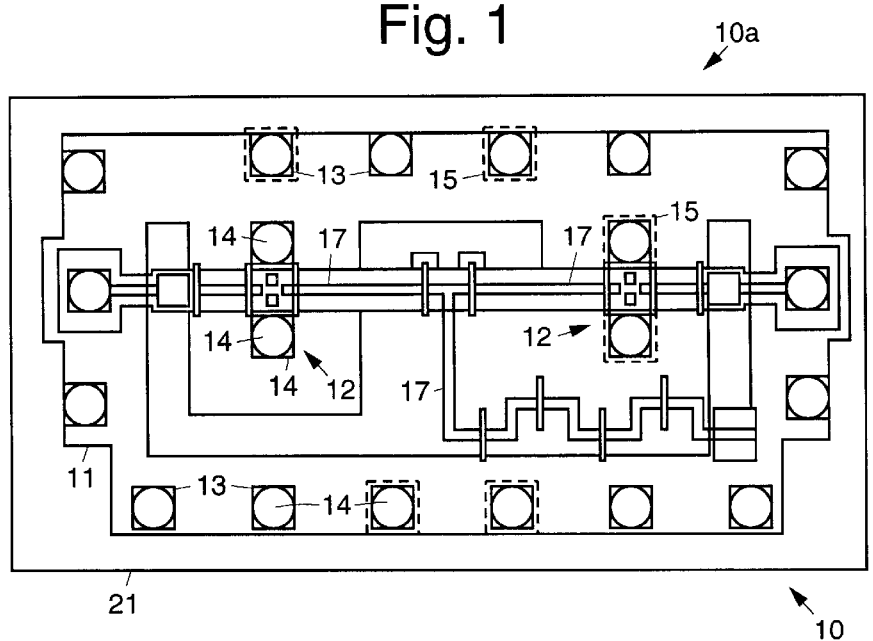
FIG. 1 is a top view of a flip chip MMIC device comprising a passive limiter in accordance with the principles of the present invention.

Referring to the drawing figures, FIG. 1 is a top view of a flip chip MMIC device 10 comprising a passive limiter 10a in accordance with the principles of the present invention. A gallium arsenide (GaAs) substrate 11 is provided on which the passive limiter 10a is formed. The passive limiter 10a comprises a plurality of limiter diodes 12 that are used as RF limiting devices. The passive limiter 10a also comprises a host substrate 21, which may be aluminum nitride, for example, disposed "above" the gallium arsenide substrate 11 in flip-chip fashion.

A plurality of plated metallized hard, plated thermal bumps 14 are used to provide RF input/output connections between RF input/output pads 13 and bonding pads 15 (selected ones are shown using dashed lines) of the host substrate 21. A plurality of thermal bumps 14 are also disposed between the limiter diodes 12 as depicted in FIG. 1 as rectangular in shape and other bonding pads 15 the host substrate 21. The thermal bumps 14 may have either a circular cross section (as depicted in FIG. 1) or have a rectangular cross section. The thermal bumps 14 provide for improved heat dissipation and power protection. The passive limiter 10a also comprises a coplanar waveguide transmission line 17 coupled between input/output ports of the limiter 10a and the limiter diodes 12, thus eliminating the need for backside processing of the gallium arsenide substrate 11. The coplanar waveguide transmission line 17 is used in place of conventionally-used face-up microstrip transmission line.

One of the primary limiting factors in the power handling capability of conventional limiters is due to failures in active diode regions. Device performance degradation is accelerated due to thermal-related failure mechanisms. During use, high incident RF levels cause large levels of current to be drawn by the limiter diodes 12. A substantial part of the incident RF power is absorbed by the limiter diodes 12 because of their series resistance. The key to good power handling is the ability to efficiently dissipate this heat away from the locations of the limiter diodes 12. This is achieved using the thermal bumps 14.

Gallium arsenide has many superior electrical properties compared to silicon. However, gallium arsenide is a poor thermal conductor. Because there is no backside processing of the gallium arsenide substrate 11, the flip chip gallium arsenide substrate 11 is 0.025" in thickness. Although mechanically robust in terms of physical handling issues, the 0.025" thick gallium arsenide substrate 11 falls short with regards to its thermal performance characteristics. To efficiently conduct heat away from the limiter diodes 12, 0.003" high plated silver thermal bumps 14 are used. By directly solder attaching the thermal bumps 14 to the host substrate 21 (aluminum nitride), an efficient thermal path is created, resulting in superior power handling performance of the limiter 10a.

As proof of this design concept, flip chip MMIC limiter devices 10a formed on gallium arsenide substrates 11 were fabricated with, and without, thermal bumps 14. Upon the completion of fabrication, various limiter devices 10a were measured using small signals to provide for insertion loss evaluation. These limiter devices 10a were subsequently mounted on aluminum nitride test substrates 21 to determine their power handling performance. It was found that the limiter devices 10a employing the thermal bumps 14 provided superior performance over those without the bumps 14.

Figure 2:
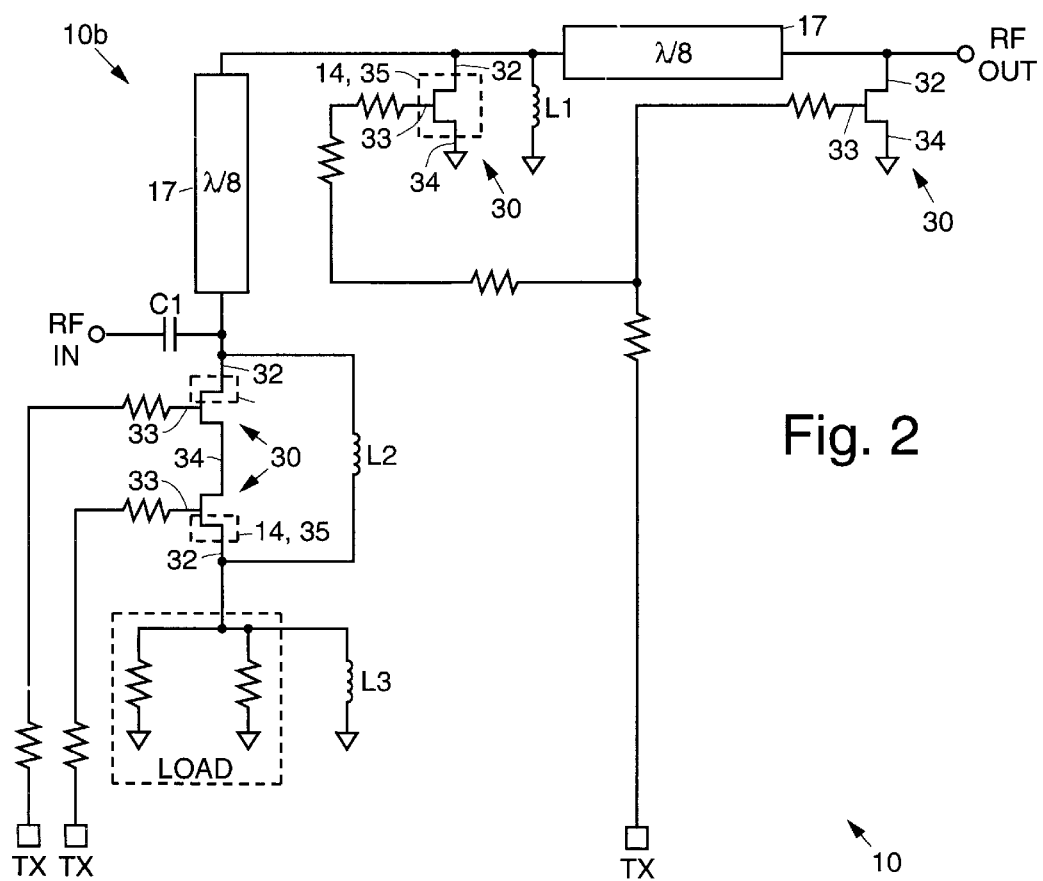
FIG. 2 is a schematic drawing of a flip chip MMIC device illustrating a transmit/receive absorptive switch in accordance with the principles of the present invention.
Figure 2A:
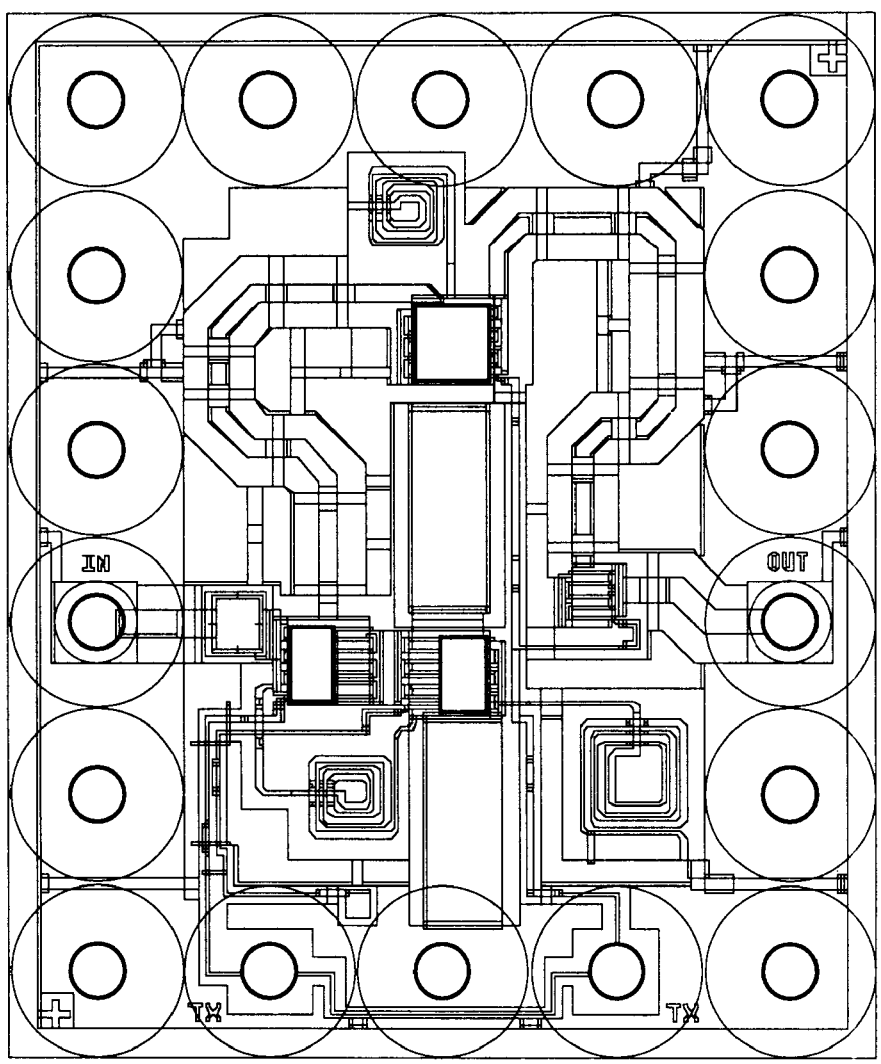
FIG. 2a is a layout of the transmit/receive absorptive switch FIG. 2.

FIG. 2 is a schematic drawing illustrating a second flip chip MMIC device 10 comprising a transmit/receive absorptive switch 10b in accordance with the principles of the present invention. FIG. 2a is a layout of the transmit/receive absorptive switch 10b FIG. 2. The transmit/receive switch 10b has an RF input (RF IN) that is coupled to an external antenna or radiator (not shown) by way of a circulator (not shown). The RF input (RF IN) is coupled to an input filter capacitor (C1). The input filter capacitor (C1) is coupled by way of first and second serially coupled $\lambda/8$ coplanar waveguide transmission lines 17 to an RF output (RF OUT). The RF output (RF OUT) is coupled to a low noise amplifier (not shown). A first absorptive switch 30 comprising a field effect transistor 30 is coupled from a point between the two $\lambda/8$ coplanar waveguide transmission lines 17 and ground and has an inductance (L1) coupled in parallel therewith. A second absorptive switch 30 comprising a field effect transistor 30 is coupled from a point between the second $\lambda/8$ coplanar waveguide transmission line 17 and the RF output (RF OUT) and ground. First and second serially coupled absorptive switches 30 comprising field effect transistors (FET) 30 are coupled to a point between the input filter capacitor (C1) and the first $\lambda/8$ coplanar waveguide transmission line 17 and a load (LOAD) having a parallel inductance (L3). Drain electrodes of the serially coupled absorptive switches 30 are coupled together.

In accordance with the present invention, the first absorptive switch 30 has a source bridge 35 (or air bridge 35) disposed thereover that bridges between respective sources 32 and respective drains 34 of the field effect transistor 30. A thermal bump 14 (or shunt 14) is formed on top of the source bridge 35. The location of the source bridge 35 and thermal bump 14 are illustrated by the dashed box over the sources 32 and drains 34 of the first absorptive switch 30. Furthermore, a source bridge 35 (or air bridge 35) bridges between respective sources 32 of each of the serially coupled field effect transistors 30 forming the serially coupled absorptive switches 30. The location of the source bridge 35 and thermal bump 14 are illustrated by the dashed boxed over the sources of the two serially coupled switches 30. The physical structure relating to this aspect of the present invention is shown in and will be discussed in more detail below with regard to FIG. 3.

Figure 3:
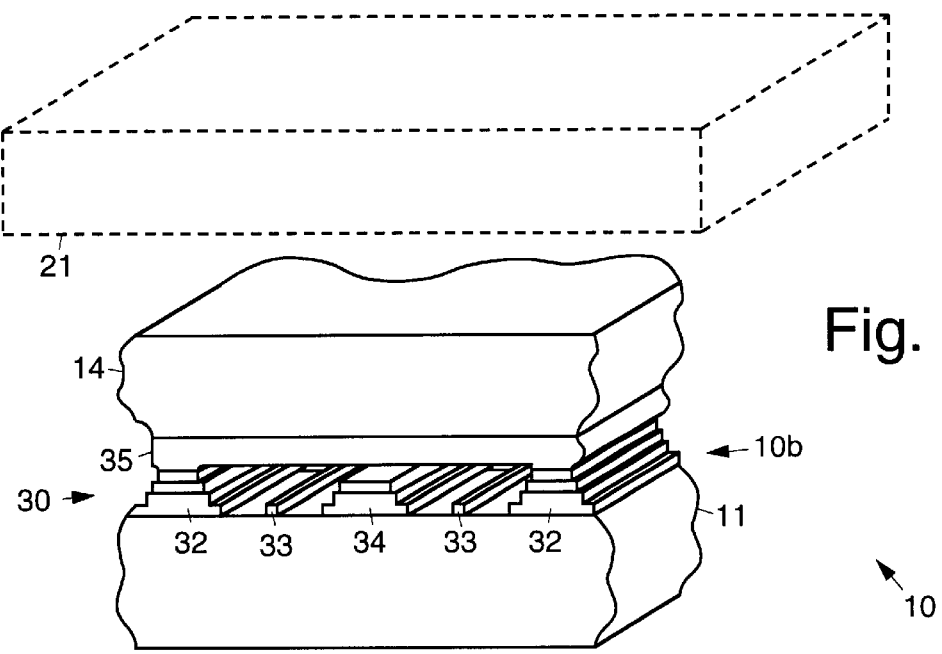
FIG. 3 shows a perspective view of a portion of the thermal bumped field effect transistor utilized in the transmit/receive absorptive switch of FIG. 2.

However, as is illustrated in FIG. 3, the thermal bumps 14 of the respective field effect transistors 30 are coupled to bonding pads on a host substrate 21. Thus, the transmit/receive absorptive switch 10b is coupled to the host substrate 21 in the manner of a flip-chip (i.e., upside down). The thermal bumps 14 are thus used to couple heat from the field effect transistors 30 to the host substrate 21.

Control signals (TX) are coupled to respective gates 33 of each of the field effect transistors 30 by way of control circuitry including resistors whose values are selected to set the voltage levels at each of the gates 33 of the of the field effect transistors 30. The control signals switch the transmit/receive switch 10b from transmit mode to receive mode, and vice versa.

In testing the transmit/receive absorptive switch 10b shown in FIG. 2, it has been found that this topology produces unexpected beneficial results. The switch 10b was designed to provide power protection in transmit mode. In the transmit mode, power received at the RF input (RF IN) is shunted through the serially coupled field effect transistors (FET) 30 into the load (LOAD). However, it has been determined during testing that the circuit topology of the transmit/receive absorptive switch 10b also provides a power protection in receive mode. In particular, in receive mode, which is the low insertion loss state of the switch 10b, the switch 10b acts as a limiter and provides a limited amount of power protection. This provides protection for the low noise amplifier in the event that unintended power is received.

FIG. 3 shows a perspective view of a portion of the thermal bumped field effect transistor 30 utilized in the transmit/receive absorptive switch 10b of FIG. 2 illustrating the primary inventive aspect of the present invention. The flip chip transmit/receive switch 10b uses thermal bumps 14 comprising plated metallized "hard" bumps 14 for I/O connections and thermal connections to the host substrate 21. The host substrate 21 may be aluminum nitride, for example.

The embodiment of flip chip transmit/receive absorptive switch 10b is formed on a gallium arsenide substrate 11 and uses thermal bumps 14 to achieve improved heat dissipation and power protection. The flip chip transmit/receive switch 10b has a plurality of field effect transistors (FET) 30 that comprise the absorptive switches 30 that are formed on a surface of the gallium arsenide substrate 11. The field effect transistors 30 each comprise source, gate and drain electrodes 32, 33, 34, respectively, that are formed on the surface of the gallium arsenide substrate 11. A source bridge 35 (or air bridge 35) bridges between the respective sources 32 of each field effect transistor 30. The thermal bump 14 (comprising a shunt 14) is formed on top of the source bridge 35.

The thermal bumps 14 of the respective field effect transistors 30 are coupled to bonding pads 15 on the host substrate 21. The flip chip MMIC transmit/receive absorptive switch 10b also uses coplanar waveguide transmission line 17 (in the manner shown in FIG. 1) coupled between RF input and output ports of the switch 10b and the field effect transistors 30, thus eliminating the need for processing the back side of the gallium arsenide substrate 11. The coplanar waveguide transmission line 17 is used in place of a conventionally-used face-up microstrip arrangement.

One of the primary limiting factors in the power handling capability of conventional FET-based switches is due to failure in the active switch FET regions. Device performance degradation is accelerated due to thermal-related failure mechanisms. In use, high incident RF levels cause large levels of heat to localize in the active switch FET regions. The key to good power handling is the ability to efficiently dissipate this heat away from the active switch FET locations. This is achieved using the present invention.

As was stated above, gallium arsenide has many superior electrical properties with respect to silicon. However, gallium arsenide is a poor thermal conductor. Because there is no backside processing of the gallium arsenide substrate 11 in the present invention, the flip chip gallium arsenide substrate 11 may be fabricated to be 0.025" in thickness. Although mechanically robust in terms of handling issues, 0.025" of gallium arsenide substrates falls short in regards to thermal performance characteristics. To efficiently conduct heat away from the field effect transistors 30, 0.003" high plated silver thermal bumps 14 are used.

The key to the switch embodiment of the present invention is the placement of the thermal bumps 14 over the air bridge 35 which "stitches" the source pads 32 of each switch field effect transistor 30. By placing the thermal bumps 14 directly on the source bridge 35 of the field effect transistors 30, the RF performance characteristics of the field effect transistors 30 are not degraded by the presence of the bumps 14. Thus, accurate models of the field effect transistors 30 for design purposes can be obtained with, or without, the presence of the thermal bumps 14. By directly solder attaching of the thermal bumps 14 to the host substrate 21, an efficient thermal path is created, resulting in superior power handling performance of the transmit/receive switch 10b.

Figure 4:
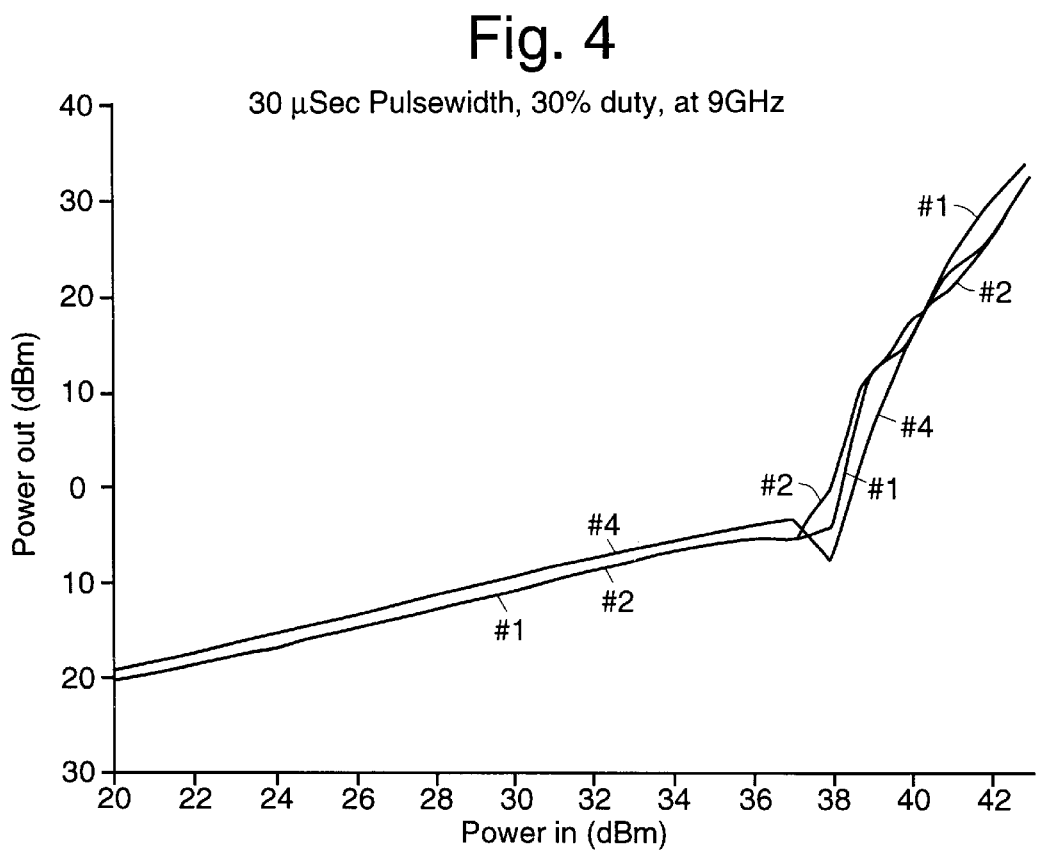
FIG. 4 is a graph showing the improved performance of the transmit/receive absorptive switch of FIGS. 2 and 3.

To prove out this design concept, various flip chip transmit/receive MMIC switches 10b on gallium arsenide substrates 11 were fabricated with, and without, thermal bumps 14. Upon completion of fabrication, both variants of the flip chip transmit/receive MMIC switches 10b were mounted on aluminum nitride test substrates 21 and rigorously tested. The test results of flip chip transmit/receive switches 10b with thermal bumps 14 is shown in FIG. 4. In addition to having low insertion loss characteristics, the flip chip transmit/receive switches 10b with thermal bumps 14 display at least twice the power handling performance compared to the variant without thermal bumps 14.

Thus, improved flip chip gallium arsenide MMIC devices that employ thermally bumped diode and field effect transistor (FET) devices have been disclosed. It is to be understood that the described embodiments are merely illustrative of some of the many specific embodiments that represent applications of the principles of the present invention. Clearly, numerous and other arrangements can be readily devised by those skilled in the art without departing from the scope of the invention.

What is claimed is:

1. A flip chip gallium arsenide monolithic microwave integrated circuit device comprising:

a gallium arsenide substrate;

a plurality of RF devices comprising field effect transistors disposed on the gallium arsenide substrate;

a host substrate;

a plurality of thermal bumps disposed between the plurality of RF devices and bonding pads of the host substrate, and between RF input/output pads disposed on the gallium arsenide substrate and bonding pads of the host substrate to couple the gallium arsenide substrate to the host substrate in flip-chip fashion;

an air bridge coupled between sources of selected field effect transistors and the thermal bumps disposed over the selected field effect transistors; and a coplanar waveguide transmission line coupled between input/output ports of the microwave integrated circuit device and the RF devices.

2. The device of claim 1 wherein the host substrate comprises an aluminum nitride substrate.

3. The device of claim 1 wherein the thermal bumps have a circular cross section.

4. The device of claim 1 wherein the thermal bumps have a rectangular cross section.

5. The device of claim 1 wherein the plurality of RF devices comprise passive diodes.

6. A flip chip gallium arsenide monolithic microwave integrated circuit device comprising:

a gallium arsenide substrate;

a plurality of RF devices disposed on the gallium arsenide substrate;

a host substrate;

a plurality of thermal bumps disposed between the plurality of RF devices and bonding pads of the host substrate, and between RF input/output pads disposed on the gallium arsenide substrate and bonding pads of the host substrate to couple the gallium arsenide substrate to the host substrate in flip-chip fashion, a coplanar waveguide transmission line coupled between input/output ports of the microwave integrated circuit device and the RF devices;

an RF input and an RF output;

and wherein the coplanar waveguide transmission line comprises first and second serially coupled $\lambda/8$ coplanar waveguide transmission lines, wherein one end of the first coplanar waveguide transmission line is coupled to the RF input and wherein one end of the second $\lambda/8$ coplanar waveguide transmission line is coupled to the RF output;

and wherein the plurality of RF devices comprise:

(i) a first absorptive switch coupled from a point between the first and second $\lambda/8$ coplanar waveguide transmission lines and ground, (ii) a second absorptive switch coupled from a point between the second $\lambda/8$ coplanar waveguide transmission line and the RF output and ground, (iii) first and second serially coupled absorptive switches coupled between the RF input and a load, and (iv) control circuitry coupled to the switches for coupling control signals thereto that switch the device between transmit and receive modes;

and wherein the device provides power protection in both transmit and receive modes.

7. The device of claim 6 wherein each of the absorptive switches comprises a field effect transistor.

8. The device of claim 6 wherein the host substrate comprises an aluminum nitride substrate.

9. The device of claim 6 wherein the thermal bumps have a circular cross section.

10. The device of claim 6 wherein the thermal bumps have a rectangular cross section.

11. The device of claim 6 wherein the plurality of RF devices comprise passive diodes.

* * * * *

UNITED STATES PATENT AND TRADEMARK OFFICE
CERTIFICATE OF CORRECTION

PATENT NO. : 5,990,757
DATED : November 23, 1999
INVENTOR(S) : Tonomura et al.

It is certified that error appears in the above-identified patent and that said Letters Patent is hereby corrected as shown below:

Column 1,
Line 6, please insert the following paragraph immediately after the heading BACKGROUND:

-- This invention was made with Government support under Contract Number N689636-97-C-0013 awarded by the Department of the Navy. The Government has certain rights in this invention. --

Signed and Sealed this

Second Day of April, 2002

Attest:

JAMES E. ROGAN
Attesting Officer   Director of the United States Patent and Trademark Office